SINGLE KNOB TUNER

Filed March 12, 1962 2 Sheets-Sheet 1

INVENTOR.
STANLEY H. GORDON

BY

OSTROLENK, FABER, GERB & SOFFEN
ATTORNEYS

SINGLE KNOB TUNER

Filed March 12, 1962 2 Sheets-Sheet 2

INVENTOR.
STANLEY H. GORDON

BY

OSTROLENK, FABER, GERB & SOFFEN
ATTORNEYS 3,233,468
SINGLE KNOB TUNER
Stanley H. Gordon, Park Ridge, Ill., assignor to Standard Kollsman Industries, Inc., Melrose Park, Ill., a corporation of Illinois
Filed Mar. 12, 1962, Ser. No. 178,820
14 Claims. (Cl. 74—10.8)

This invention relates to an improvement in tuners for television receivers, and more particularly to a combined channel selector switch and fine-tuner driven selectively by the same knob.

In a television receiver, the rotary channel selector switch has several positions, either corresponding to the various channels that may be available for reception or limited to the specific channels that may be received by the receiver. In each of the provided positions, the switch renders certain tuning elements effective, such as inductors or capacitors, which are previously adjusted for the reception of the signals at the frequency of that particular channel with which those tuning elements are associated. Because of changing ambient conditions, and deviations in the parameter values or characteristics of the components in the receiver, the most accurate adjustment during manufacture may be affected by the contemporaneous conditions to such an extent that some additional slight re-adjustment or fine-tuning may be necessary to establish proper tuned conditions, under the slightly changed conditions of the new environment, or after some use.

It is therefore desirable to make some provision for additionally fine-tuning each of the channels to compensate either for errors in the original adjustment or for deviations in the settings of the main tuning elements after use.

For a satisfactory construction of a television receiver, which will permit switching from one channel to another at will, it is desirable that the fine-tuning for each individual channel shall be effective for that channel only, since, generally, any fine tuning required for one channel, according to its frequency, is not satisfactory for any other channel. Consequently, a conventional system that employs a common trimmer condenser operable by its own separate knob, must be re-adjusted for each channel where the channel circuitry has not been itself adjusted with fine tuning. Therefore, generally, two knobs have been required, the switch operating knob and the fine-tuning control knob.

One object of this invention is to provide an improved combination channel selector switch and fine tuner.

Another object of this invention is to provide a combined channel selector switch and fine-tuner that is operable by a single knob.

Another object of this invention is to provide a combination channel selector switch and fine-tuner, with a single operating knob, that can selectively perform the channel selecting operation, and then shift to the fine-tuning operation when such operation is desired.

In a multi-channel tuner, the circuit sections for each channel are arranged to be individually tuned. By adjusting a tuning element individually for its own channel, the tuning of one channel is independent of the tuning of the others.

In the present invention, co-axial shafts, one inner and one outer, are utilized. The inner shaft serves to operate the channel selector switch and also serves as a bearing for the outer shaft. The outer shaft serves to drive the inner shaft through a clutch for channel selection. For fine tuning, the outer shaft may be de-clutched from the inner or selector switch shaft, and shifted to control the fine-tuning of the circuit section of the selected channel. A bias spring normally biases the two shafts to clutching position, but such clutching operation occurs only when the two shafts are in a predetermined angular position, thereby assuring that the two shafts when clutched will be always in the same relative position. That is an important feature to assure proper identification of the switch position.

A single knob controls the switch channel selecting operation and then the fine tuning, in accordance with the present invention. This knob is mounted on the outer of the co-axial shafts. When the two shafts are clutched, the single knob serves to drive the outer shaft, and, through it, the inner shaft, which rotates the channel selector switch. The outer shaft is axially movable on the inner shaft. Thus, after the single knob has rotated the two shafts to the selected channel position, and the circuit section for that channel is made effective, the single knob upon axial pressure against the bias force, moves axially to de-clutch the two shafts. Then, upon further axial movement of the outer shaft, a gear carrier thereby is meshed to an actuating element associated with the fine-tuning system and a selected channel circuit fine tuning element. The fine-tuner system is engaged by the axial movement of the outer shaft, but fine tuning does not occur until the knob is rotated. Thus the single knob first drives the selector switch, then de-clutches from the shaft of that switch and shifts to mesh gears with the fine tuning system to drive the selected fine-tuning circuit element.

After the fine-tuning operation, the outer shaft may be in random position with respect to the inner shaft controlling the channel selector switch. In order that the channel identifying symbols or numbers may be significant, the outer shaft must be re-clutched to the inner shaft in proper orientation so that the knob position will be designated by the appropriate channel identification corresponding to the switch setting. For that purpose, the clutch between the two shafts is so made that the clutching operation can be established in only one predetermined angular relationship between the two shafts. That is an important feature of this invention.

When the fine tuning operation is completed, and the forward manual pressure on the single knob is relieved, the bias force will disengage the fine-tuning unit from the actuating shaft. The knob must then be rotated until the two shafts are in the proper angular position that will relate them to the channel identifications. At this point clutching between the two shafts will be re-established.

A further feature of the invention resides in the manner in which the fine-tuning assembly is disposed alongside the co-axial shafts, in non-operating position, so those shafts may be of relatively short lengths, with means for lateraly shifting the fine-tuning assembly to operating position relative to the outer shaft when that outer shaft is de-clutched from the switch shaft. Thus, the fine-tuning elements are not actuated in any way unless they are actually desired for a fine-tuning operation. Further, since the fine-tuning operation involves relative small torque requirements, the parts to be used for that fine-tuning operation may be made of small dimensions and light material, metal or plastic.

A further object is to provide, in a single knob arrangement for channel selecting and fine tuning, means whereby an axialy shifting the knob to drive the fine tuning system, direct engagement of said fine tuning system takes place. Previous single knob systems, have generally required that after the knob is axially shifted, it must be rotated up to a quarter of a turn before the fine tuning system is engaged.

A further object of the invention is to eliminate sticking or binding of the fine tuning control when it is rotated to either limit of the fine tuning range. Previous designs for single knob operation of both fine and tuning and channel selection controls generally use a circular array of screws associated with respective channels. These screws tend to bind when driven to either limit of their operation, making it difficult to determine which direction to turn the knob to free a particular screw.

A further object of the invention is to mount the fine-tuning assembly laterally displaced from a longitudinal dimension, in a lateral space otherwise available, so the longitudinal dimension may be made smaller than if the fine-tuning assembly were included in a longitudinal disposition.

The principle of operation of the invention, and the manner in which an embodiment thereof is constructed and functions, are explained in the following specification, and in the drawings, in which.

Figures 1, 4:
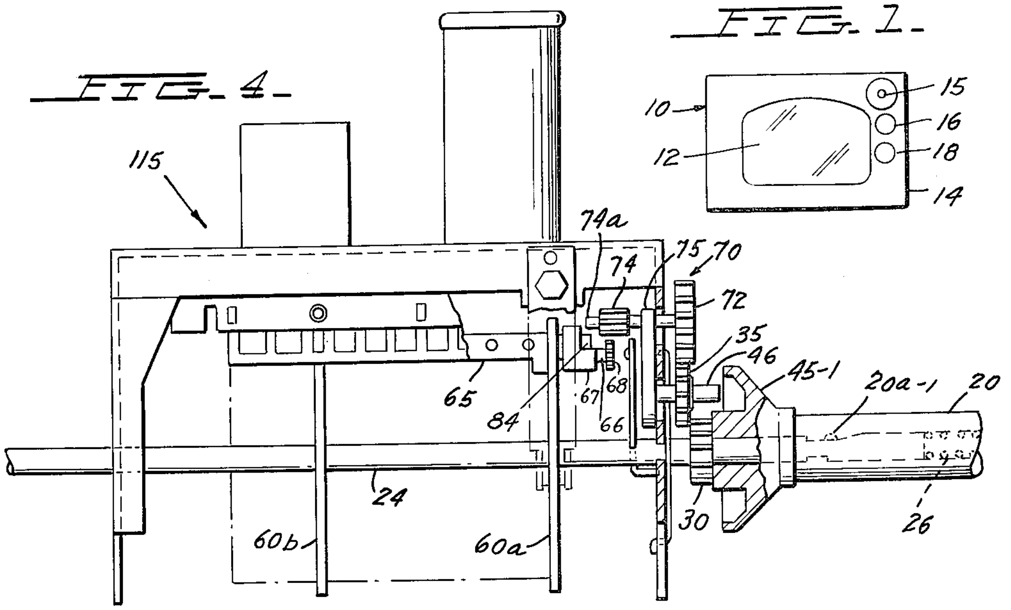
FIGURE 1 is a schematic front view of a television set, and illustrates one location of the single control knob for the channel selector switch and the fine-tuning, and shows other related knobs for other operations of the set.
Figure 5:
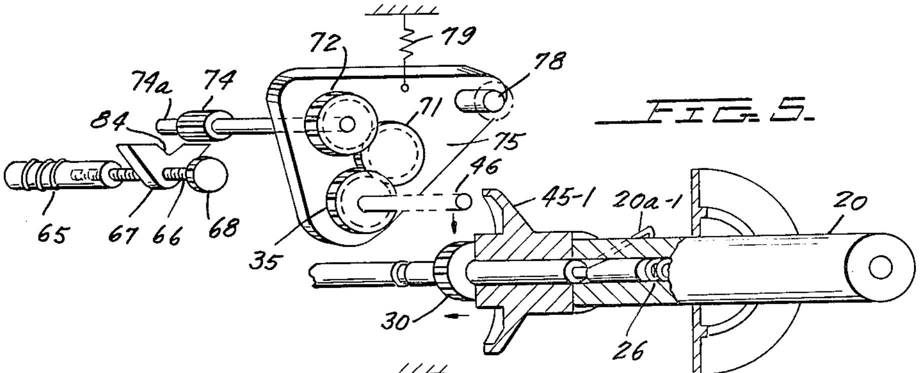
Figure 6:
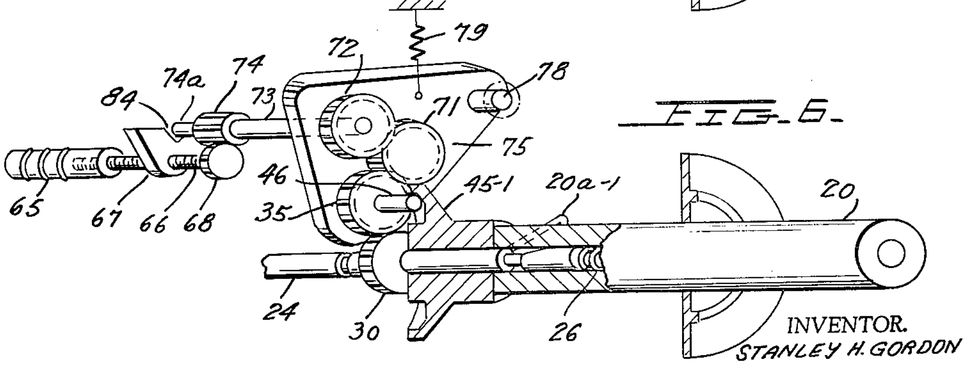
Figures 2, 3, 3A:
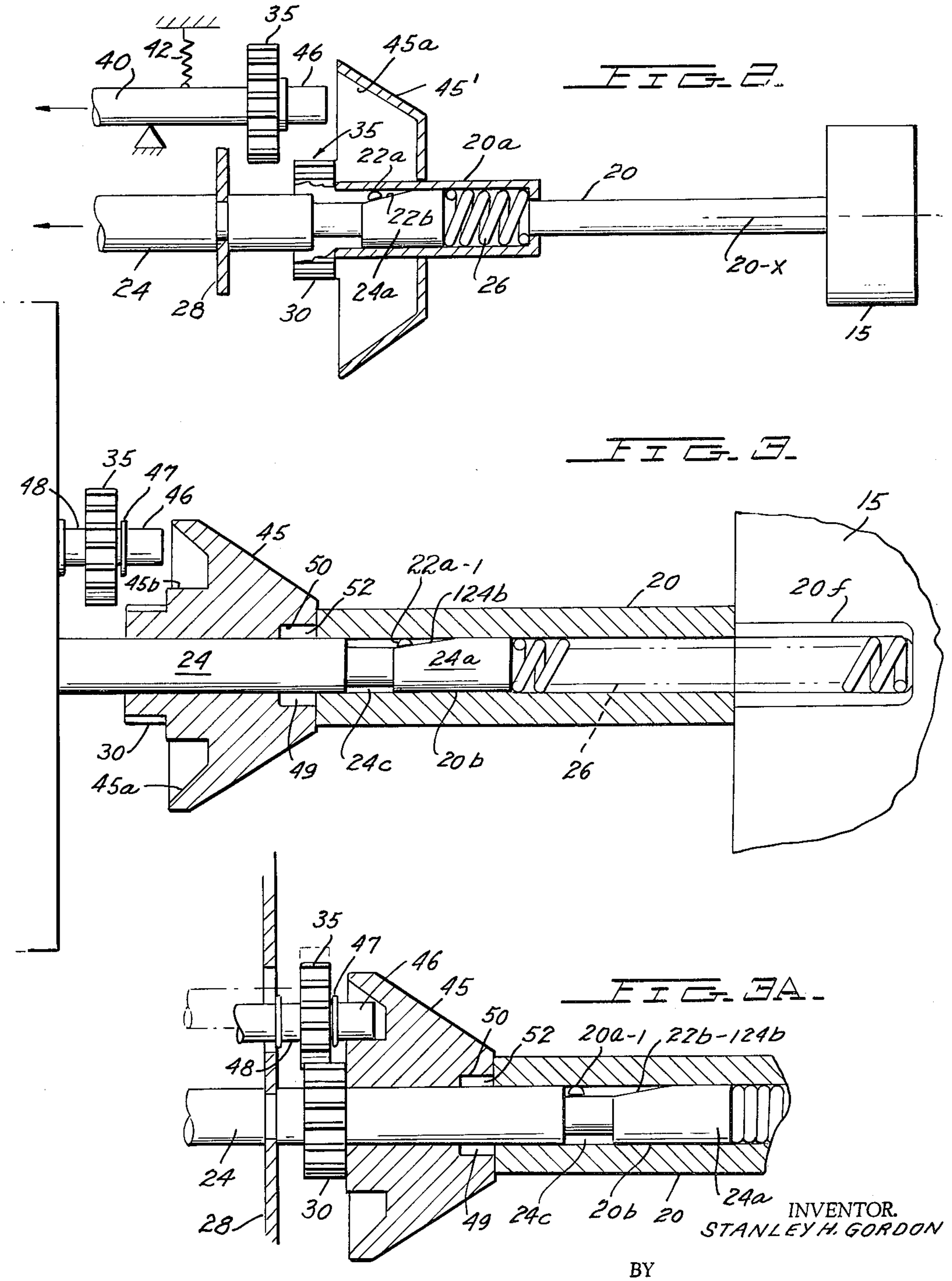
FIGURE 2 is a schematic view of a mechanical arrangement to show how a single operating knob selectively controls either a channel selector switch or a fine-tuning assembly.

FIGURE 3 is a side view, partially in elevation and partially in section, of the co-axial shaft arrangement with the single knob, and shows the clutch between the two shafts for assuring clutching action in only one related position of the two shafts, and shows also the means for driving the fine-tuning control gear for the circuit section that is connected in operating position in the channel selector switch;

FIGURE 3A is a side view partially in elevation and partially in section, corresponding to that shown in FIGURE 3, but showing the clutch between the two shafts in the de-clutched position and the cooperating gear members engaged for fine tuning operation;

FIGURE 4 is a side elevational partial view of a tuner constructed in accordance with the principles of this invention;

FIGURE 5 is a schematic and partially perspective view showing functional details and arrangement of the fine-tuning element;

FIGURE 6 is a view similar to FIGURE 5, with the components of the fine-tuning unit shown in engaged position ready to be driven by the single knob, with the clutch between the two shafts shown in non-clutching position, thereby freeing the outer shaft to rotate as required during fine tuning.

As shown in FIGURE 1, the front of a conventional television set 10 displays the face of a television tube 12 disposed in the window of a framing enclosure or box 14, the front wall of which supports various control knobs, including a main single control knob 15 for controlling a selector switch to connect the television receiver 10 with its appropriate tuning circuitry in effective position to tune in a desired channel, the single knob 15 being effective also to fine-tune the connected circuitry for such selected channel. Two other knobs 16 and 18 are indicated merely as illustrative of the usual control knobs for performing other operations in the receiver.

One functional feature of the invention is schematically indicated in FIGURE 2. The single knob 15 is mounted on the end of a drive shaft 20. When shaft 20 is rotated by the knob, it will operate through a clutch 22 to correspondingly rotate the channel selector switch shaft 24 to a position corresponding to the channel to be selected for tuning, in the television receiver.

When the knob 15 is merely rotated, the clutch 22 remains effective to couple the drive shaft 20 to the switch shaft 24 so that rotation of the single knob 15 will operate the channel selector switch.

This operation connects the circuitry in the television receiver that is usually pre-tuned and pre-set to an appropriate channel frequency. If the initial factory tuning or any subsequent adjustment has been sufficient to tune that circuitry properly, so that the circuit remains properly tuned to the frequency of the corresponding channel, no further movement or action on the part of the single knob 15 is necessary.

However, if conditions have occurred to cause the existing tuning adjustment to be slightly off, then a slight fine-tuning adjustment may be necessary to restore the circuitry to proper tuning for that channel.

A slight deviation in the tuned condition of any specific channel does not necessarily imply a corresponding deviation in the tuned condition of any other channel. Consequently, any fine tuning that is provided for any one channel is preferably applied to that particular channel alone, so that no effect will consequently be impressed upon the tuning of any other channel circuitry.

Assuming now that the circuitry of a selected channel does require some fine tuning, the knob 15 must first be pressed axially inward against the force of a reaction spring 26, that is braced against a suitable stationary surface of the structure 28, and such axial inward movement of knob 15 serves to disconnect clutch 22 thereby disengaging the drive shaft 20 from the switch operating shaft 24.

The clutch 22 is schematically indicated as a roller *22a* riding up on an inclined surface *22b* and simultaneously engaging the inner surface of an outer clutching element *20a* that is mechanically connected to the drive shaft 20 and that may be considered as a continuation of the drive shaft 20.

To illustrate further the function of the invention, the front end of the clutch element *20a* is shown supporting a gear 30 concentric with the axis 20–X of the drive shaft 20.

When the single knob 15 is pressed axially inward, the clutch roller *22a* disengages the inclined surface *22b*, thereby disengaging the drive shaft 20 from the secondary or switch shaft 24. During the rotation of the knob 15 to operate the channel selector switch, said gear 30 had operated freely within its path. When the knob 15 is pressed axially inward, the gear 30 is moved inwardly, compressing the bias spring 26. The driving gear 30 may then be engaged by and meshed with the tuning gear 35 which serves to drive a fine tuning shaft 40 to adjustably fine tune the related tuning circuit for the connected channel. The tuning gear 35 is appropriately mounted to be tilted downwardly, for illustration, in order to engage and mesh with the driving gear 30. A restraining spring 42 is schematically shown to indicate a bias force that normally holds the tuning gear 35 in raised position, out of engagement with and out of the path of rotation of, the driving gear 30.

In order to tilt the tuning gear 35 downward in the direction of the arrow *35a*, a conical bracket 45', is supported on the auxiliary part of clutching element *20a*, so that forward movement of the drive shaft 20 in response to pressure on the knob 15, will move the conical bracket 45' forward to frictionally engage and to lower a tip or shaft extension 46 that is mechanically related to the fine-tuning shaft 40 and to the tuning gear 35. As shown in the arrangement in FIGURE 2, the conical bracket 45' is provided with an inclined inner surface *45a* that engages the end of the tip 46 and forces that tip end 46 downward to tilt the tuning gear 35 also downward sufficiently to engage and mesh with the drive gear 30.

While the drive gear 30 and the tuning gear 35 are engaged and meshed, subsequent rotation of the single knob 15 imparts a corresponding turning movement to the fine-tuning shaft 40 which controls a suitable screw thread arrangement, to be shown later, which shifts an adjustable tuning element to establish the proper tuned condition in the circuitry for the connected channel.

When the desired fine-tuning has been achieved, the direct axial pressure on the knob 15 by the operator is relieved, and the bias pressure built up in the compressed bias spring 26 will disengage the fine tuning system from the drive gear 30. The knob may then be rotated freely without "de-tuning" the fine tuning adjustment. Rotation may be continued until the clutch 22 engages.

An additional feature of the invention is that the clutch 22 becomes effective to connect the drive shaft 20 and the switch operating shaft 24 in only one predetermined relative angular position. The drive shaft 20 may assume any random position during the fine tuning operation, while it is disconnected from the shaft 24 for the channel selector switch. The restoration of the drive shaft 20 and the operating knob 15 to its normal clutching position, mechanically connected to the channel selector switch shaft 24, is prevented until the knob 15 and the connected drive shaft 20 are rotated to proper clutching position. At that position, engagement occurs, and the knob and the drive shaft 20 will indicate, on any related dial, the proper channel to which the switch is connected.

In FIGURE 3 is shown a more detailed illustration of the construction of the two shafts 20 and 24 with the clutch between them, and a conical body arrangement for tilting the fine-tuning gear.

As shown in FIGURE 3, the drive shaft 20 is provided with a suitable flat 20–F at its outer end to receive the single knob 15. The opposite end of shaft 20 is provided with a central co-axial bore 20–B of appropriate diameter to receive the end 24*a* of the channel switch shaft 24. The clutch for coupling the two shafts 20 and 24, consists of a roller pin 22*a*–1 corresponding to the roller 22*a* in FIGURE 2, except that in this case, in FIGURE 3, the roller pin 22*a* penetrates the two walls of the shaft 20 to constitute, in effect, a chord line surface as a substantially linear locus to be engaged by a flat inclined surface 24*b* formed as an inclined flat on the shaft near end 24*a* of the switch shaft 24.

In order to permit the clutch roller pin 22*a*–1 to disengage the switch shaft 24 when the drive shaft 20 is pressed axially inward by the single knob 15, the shaft 24 is provided with an annular or cylindrical groove 24*c*, undercut on the periphery of the shaft 24, so the drive shaft 20 may in this position be freely rotated without the roller pin 22*a*–1 engaging the selector switch shaft 24.

Thus, when the drive shaft 20 is forced axially inward against the bias spring 26, the roller pin 22*a*–1 shifts off the flat inclined surface 24*b* to the region of the groove 24*c*, thereby declutching shaft 20 and 24 and permitting free relative movement between those two shafts.

As previously indicated, the axial inward pressure on the knob 15 to disengage the clutch between the two shafts 20 and 24 must be maintained to permit fine-tuning. When such fine-tuning is completed, pressure on the knob is relieved, and the bias spring 26 moves the drive shaft 20 back towards clutching position far enough so that rotation of shaft 20 will no longer drive the fine-tuning system. However, the clutch action between the roller pin 22*a*–1 and the inclined surface 24*b* is in the predetermined position for engagement with the lower chord surface of the pin 22*a*–1.

The conical bracket 45′ of FIGURE 2 is represented by the truncated conical body 45 in FIGURE 3. The tapered conical surface 45*a* of FIGURE 2 corresponds to that same tapered conical surface 45*a* in FIGURE 3. In addition, the conical body 45 embodies a shoulder or stop surface 45*b* for the element 46 shown in FIGURE 2 and in FIGURE 3, which represents, functionally, a shaft for supporting the fine-tuning gear 35. A snap ring 47 is shown to hold the gear 35 in place on the shaft 46 against an appropriate shoulder portion 48.

The conical body 45 of FIGURE 3 is supported on, but freely rotatable with respect to, the switch shaft 24. The outer end of the conical body 45 is provided with a bore 49 having a flat 50. A tubular extension on the inner end of the drive shaft 20 is shaped to fit into the bore 49 and has a flat 52 to engage the flat 50. The inner end of the conical body 45 is provided with the drive gear 30, which serves as the drive gear when it is engaged by the fine-tuning gear 35 associated with the fine-tuning circuitry.

Reference may now be made to FIGURE 4, which shows the overall tuner 115, to illustrate the manner in which the shaft 24 for the channel selector switch is disposed, and also how the fine-tuning unit is supported and disposed to control a specific tuning circuit when such tuning circuit is placed in operative circuit condition to tune-in the related channel.

As shown in FIGURE 4, the selector switch shaft 24 supports and rotates two circular brackets or wafers 60*a* and 60*b*, as a carriage, for a number of tuning units such as tuning unit 65. These are pre-tuned to the frequency of the channel to which they respectively relate.

The tuning unit 65 comprises a tuning coil section within which a metallic slug is movable as a core for the coil, to vary the inductance of the coil to the value necessary to tune that circuit to the corresponding frequency. The metallic core is axially shifted within the coil by means of a threaded element 66 appropriately supported on a bracket 67 of suitable dielectric insulation, and the adjustment of the threaded element is achieved by means of a slug shifting gear 68 for rotating the threaded element to axially shift the tuning slug to achieve desired tuning.

As previously explained, when the single knob 15 has performed the operation of moving the switch to the desired channel, the appropriate tuning circuitry, here the unit 65, will be effectively connected by elements of the switch, to generally tune the system to the incoming frequency. Assuming now that some fine-tuning is required, the drive shaft 20 and the switch shaft 24 can be disconnected at the clutch 22 by pushing the knob in towards the tuner. When the knob has been pushed in as far as it will go, the conical body 45–1 will be effective to couple the drive gear 30 to the fine-tuning gear 35 to transmit any turning force from the knob to the slug shifting gear 68, for adjustably shifting the tuning slug in the tuning unit 65.

The fine-tuning assembly in FIGURE 4 comprises, in addition to the fine-tuning gear 35, an idler 71, a pinion 72 driven by the idler, and a tuning pinion 74 which is arranged to engage the slug-shifting gear 68, when the entire tuning assembly is pivoted to enable the fine-tuning gear 35 to engage the drive gear 30, as was schematically indicated in FIGURE 2. It is sufficient to state that when the fine-tuning gear 35 for the fine-tuning unit is meshed with the drive gear 30, the fine-tuning pinion 74 will be meshed with slug shifting gear 68. Rotation of the drive gear 30 will thus be transmitted through the gears of the fine-tuning unit to the slug-shifting gear 68 to establish the necessary and desired fine-tuning operation.

As indicated in FIGURE 4, the fine-tuning elements, including the gear 35, the idler gear 71, the intermediate gear 72 and the fine-tuning pinion 74, are all supported on a pivoted bracket 75 that is appropriately pivoted to permit the entire tuning assembly of the gears to be shifted into and out of connection with the drive gear 30 coupled to the drive shaft 20.

As shown in FIGURE 5, the tuning gear 35 and the idler 71 and the driven pinion 72 are supported on the bracket 75, which is, in turn, pivotally supported on a pin 78 and biased to a disengaged position by a biasing spring 79, which corresponds essentially to the spring 42 of FIGURE 2. The driven pinion 72 is connected to one end of a shaft 73 supported by the bracket 75. The other end of the shaft 73 carries a final driven pinion 74. The pinion 74 is provided with a shaft extension 74*a* that serves as an end positioning support to seat into a pocket 84 on an end bracket 67 for the tuning unit 65. The driven tuning pinion 74 is thus positioned to engage and mesh with gear head 68 of the slug-shifting threaded element 66. This meshed engagement is obtained without radial pressure that would distort the threaded element 66 and shift the metallic core in its tuning coil.

FIGURE 6 shows the tuning assembly of FIGURE 5 in operative engaged position. The bracket 75 has been pivoted by the inner inclined surface 45*a* of the conical body 45–1 frictionally pressing on the top edge of shaft extension 46. The bottom edge of that shaft extension 46 then engages shoulder 45*b* which limits the downward movement of the shaft extension 46, and also of the bracket 75, and also of the pinion 74. That pivotal movement of bracket 75 is sufficient, however, to mesh driving gear 30 on drive shaft 20 with the fine-tuning gear 35 of the fine-tuning assembly on bracket 75.

By disposing the fine-tuning assembly on bracket 75 for transverse movement relative to the longitudinal dimension of the tuner, the tuner shaft may be shortened, since the fine-tuning assembly may be disposed normally transversely of the axis in space usually available. The entire tuner may, therefore, be made shorter in length.

Thus, according to the invention herein, a control arrangement has been provided in which a single knob may control a channel selector switch, and then control the fine-tuning circuitry of the selected channel.

Although I have described preferred embodiments of my novel invention, many variations and modifications will now be obvious to those skilled in the art, and I prefer, therefore, to be limited not by the specific disclosure herein, but only by the appended claims.

The embodiments of the invention in which an exclusive privilege or property is claimed are defined as follows:

1. In a television tuner for selectively tuning to one of a plurality of channels, the combination with a main tuner shaft for selectively switching to a position corresponding to a desired or selected channel, means carrying a plurality of tunable circuit means; said main tuner shaft including connecting means coupling to said carrying means for rendering a selected one of said plurality of tunable circuit means effective, upon movement of said main tuner shaft to each such position for tuning-in the frequency band of that channel; said connecting means including clutch means for engaging the main tuner shaft and for actuating said carrying means responsive to movement of said main tuner shaft to any selected channel position, said clutch means including means for disengaging said carrying means and for then engaging the selected tunable circuit means with said main tuner shaft when the main tuner shaft is at such selected channel position, said last mentioned means including means for tuning the related tunable circuit.

2. The combination television tuner as in claim 1, in which the clutch means includes actuator means normally coupling said carrying means to said main tuner shaft for rotatably positioning said carrying means, and said clutch means further includes means operable by said actuator means to decouple said carrying means from said main tuner shaft, and to couple said main tuner shaft to said tunable circuit means when the main tuner shaft is at any selected channel position, and said means being also operable by said actuator means for decoupling said main tuner shaft from said selected tunable circuit means in order to recouple said carrying means to said main tuner shaft.

3. A television tuner for selectively tuning-in a selected one of a plurality of channels, said tuner comprising a plurality of channel tuning elements, each related to a specific channel; means carrying said plurality of channel tuning elements; a tuning gear for fine tuning each such channel tuning element; a main channel selector shaft connected to said carrying means for selecting a desired channel tuning element; an operating shaft, an operating knob on said operating shaft, main, or first, clutch means operative in one terminal position to couple the operating shaft to said channel selector shaft, and operative in a second terminal position to declutch said operating shaft and said channel selector shaft; said clutch when in said one terminal positioned mechanically coupling said carrying means to said operating knob via said operating shaft and channel selector shaft; bias means urging said main clutch means toward clutching position at said one terminal position to couple the operating shaft to said selector shaft; second clutch means normally biased by said bias means to non-clutching position, and adapted to be moved to clutching position when pressure on said knob is sufficient to overcome said bias means and move said main clutch means to said second terminal position, said second clutch means then serving to mechanically couple the operating shaft to the tuning gear of a selected channel tuning element in operating position.

4. A television tuner, as in claim 3, in which said second clutch means is mechanically connected to and operable by said knob to fine tune a channel tuning element disposed in operative tuning position.

5. A television tuner, as in claim 4, in which said main clutch means includes registry means for clutching the knob to the channel selector shaft only in a predetermined angular co-relationship on the channel selector shaft, thereby assuring correct position identification of the channel selector shaft relative to the several channels, when said main clutch means is restored to clutching position on the channel selector shaft, after a de-clutching operation for operating the second clutch means for fine-tuning.

6. A television tuner, as in claim 5, in which said main clutch means includes a hollow shaft co-axially supported on and extending from said main shaft and axially shiftable on said main shaft; said registry means including a first clutch element on said hollow shaft; a cooperating second clutch element on said main shaft for engaging the first clutch element only in one predetermined relative angular position.

7. The combination in a television tuner, as in claim 1, including a single knob at the end of said main shaft means; a main shaft section intermediate said single knob and said clutch means which serves to operate said clutch means to a first position to selectively operate said carrying means; and to a second position to disengage from said carrying means and to operate said selected tuning means, to effect channel selection as a first operation at said first position, and then fine-tuning as a second operation at said second position, both by single knob operation.

8. A television tuner of the channel selector type, including in combination, channel selector means; a plurality of individualy adjustable fine-tuning control means, one for each channel; a pair of co-axial shafts capable of relative co-axial movement and independent rotation; a single knob fixed on a first one of said shafts for axial shifting movement and for rotating said one shaft; bias means; first clutch means interconnecting to said shafts to form a coupling therebetween; said first clutch means normally biased by said bias means to mechanically clutch both shafts for joint rotation by said single knob and said clutch means being operable by said single knob to de-clutch both shafts for independent operation; means coupling the second shaft to said channel selector means; and second clutch means connected to said first shaft and operable by said knob, after de-clutching both shafts, for coupling said first shaft to the fine-tuning control means of a selected channel.

9. A television tuner including in combination, a single knob for channel selection and for tuning; first and second co-axial shafts, the first one of said shafts supporting said knob, and said first shaft being axially movable on said second shaft; spring means along one of said shafts for urging said first shaft axially to a predetermined position on said second shaft; clutch means interconnected to said shafts to form a coupling therebetween; said clutch means coupling together the two shafts when the first shaft is axially shifted to said predetermined position; a channel selector switch; means coupling said second shaft to said channel selector switch; a plurality of separate rotatable tuning elements, rotatably positionable on a circular locus, with one for each channel of said selector switch; and an actuating tuner member, normally radially spaced from said locus, and actuable by said first shaft, upon axial pressure shift of said knob, whereby axial movement of said first shaft declutches the two shafts and moves said actuating tuner member to a tuning position at said circular locus and in actuating relationship with a rotatable tuning element at said tuning position, said actuating tuner member being then operable to adjust the rotary tuning member to a desired setting.

10. A television tuner including in combination a single tuning knob; first and second shafts co-axial about a main axis with means on the first shaft to support the single knob; means supporting said shafts, with the first axially movable on the second shaft; spring means along one of said shafts for urging said first shaft axially to a predetermined position; means interconnected to said shaft for clutching said first and second shafts; means for connecting said second shaft to a channel selector switch; a plurality of separator tuning units, one for each channel of said selector switch, and each tuning unit having a tuning element to be driven with a fine adjustment; a fine-tuning assembly normally in a non-operating position radially spaced from said main axis, and radially movable to operating position for tuning a selected one of said separate tuning units, said fine-tuning assembly including gear means and a fine-tuning driving element adjustable thereby to drive the driven tuning element of a selected channel tuning unit; gear means supported on said first shaft and movable to an operating position when said first shaft is pressed axially against said spring means, and additional means supported on said first shaft for shifting the fine-tuning assembly radially to operating position to be engaged by said gear means to tune the tuning unit selected by the selector switch.

11. A television tuner, as in claim 10, in which said additional means for shifting the fine-tuning assembly includes stop means for limiting said shifting movement to a predetermined stop limit to prevent stress on the elements of the fine-tuning assembly.

12. A television tuner, as in claim 10, in which said clutching means includes registry means for establishing clutching action only when the two shafts are in predetermined relative positions.

13. A television tuner, comprising a channel selector switch; an operating shaft for the switch; individual circuitry for each channel, comprising at least one coil having an axially adjustable tuning core; means for axially adjusting the position of the core; a fine-tune assembly including a pinion to drive the core adjusting means, and an actuating gear on a common shaft with said pinion and a plate for supporting said common shaft, said supporting plate being normally radially spaced from the axis of the switch-operating shaft; a fine-tuning shaft concentric with the operating shaft for the switch; a drive gear on said fine-tuning shaft for driving the actuating gear of the fine-tune assembly; and means supported and driven by the fine-tuning shaft for first frictionally engaging and shifting the suporting plate of the fine-tuning assembly radially to a position at which the drive gear on the fine-tuning shaft is meshed to the actuating gear of the fine-tune assembly, after which the fine-tune shaft can operate the actuating gear to drive the pinion to adjust the position of the core to achieve desired fine tuning; means for separably coupling the switch operating shaft and the fine-tuning shaft; and a single operating knob at the terminus of said shaft; and means selectively coupling said single operating knob in driven relationship with either of said shafts for selectively operating either shaft.

14. A television tuner, comprising a channel selector switch; an operating shaft for the switch; circuitry for each channel, including a coil and an axially adjustable tuning core; means for axially adjusting the position of the core; a fine-tune assembly including a pinion to drive the core adjusting means, and an actuating gear on a common shaft with said pinion and a plate for supporting said common shaft, said supporting plate being normally radially spaced from the axis of the switch-operating shaft; a fine-tuning shaft concentric with the operating shaft for the switch; a drive gear on said fine-tuning shaft for driving the actuating gear of the fine-tune assembly; and means supported and driven by the fine-tuning shaft for first frictionally engaging and shifting the supporting plate of the fine-tuning assembly radially to a position at which the drive gear on the fine-tuning shaft is meshed to the actuating gear of the fine-tune assembly, after which the fine-tune shaft can operate the actuating gear to drive the pinion to adjust the position of the core to achieve desired fine tuning; means for separably coupling the switch operating shaft and the fine-tuning shaft; and a single operating knob at the terminus of said shaft; and means selectively coupling said single operating knob in driven relationship with either of said shafts for selectively operating either shaft; said means for shifting the supporting plate being normally mechanically disengaged and uncoupled from said supporting plate and being effective upon axial movement of said fine-tune shaft, to cause said shifting of said supporting plate for the fine-tune assembly.

References Cited by the Examiner

UNITED STATES PATENTS

| | | | |
|---|---|---|---|
| 2,788,668 | 4/1957 | Sperber | 74—10.45 |
| 3,058,075 | 10/1962 | Polley | 74—10.8 |
| 3,090,932 | 5/1963 | Torrence | 74—10.45 X |

BROUGHTON G. DURHAM, *Primary Examiner.*

DON A. WAITE, *Examiner.*